United States Patent [19]
Perino et al.

[11] Patent Number: 6,160,716
[45] Date of Patent: Dec. 12, 2000

[54] MOTHERBOARD HAVING ONE-BETWEEN TRACE CONNECTIONS FOR CONNECTORS

[75] Inventors: Donald Perino, Los Altos; David Nguyen, San Jose, both of Calif.

[73] Assignee: Rambus Inc, Mountain View, Calif.

[21] Appl. No.: 09/344,016

[22] Filed: Jun. 25, 1999

Related U.S. Application Data

[62] Division of application No. 08/925,243, Sep. 8, 1997, Pat. No. 5,887,833, and a division of application No. 09/024,822, Feb. 17, 1998.

[51] Int. Cl.⁷ ...................................................... H05K 1/14
[52] U.S. Cl. .......................... 361/785; 361/788; 361/775; 439/61; 439/631; 174/250; 174/262; 174/266
[58] Field of Search .............................. 439/61, 631, 67; 361/785, 788, 775, 803; 174/250, 262, 266

[56] References Cited

U.S. PATENT DOCUMENTS

| | | | |
|---|---|---|---|
| 3,868,166 | 2/1975 | Ammon | 439/634 |
| 4,026,014 | 5/1977 | Sugimoto et al. | 29/629 |
| 4,795,374 | 1/1989 | Rishworth et al. | 439/634 |
| 5,040,991 | 8/1991 | Collier | 439/60 |
| 5,094,623 | 3/1992 | Scharf et al. | 439/101 |
| 5,197,887 | 3/1993 | Davidge et al. | 439/60 |
| 5,334,038 | 8/1994 | Davidge et al. | 439/267 |
| 5,397,861 | 3/1995 | Urquhart, II | 174/250 |
| 5,401,185 | 3/1995 | Wang et al. | 439/441 |
| 5,470,246 | 11/1995 | Mosquera | 439/260 |
| 5,548,734 | 8/1996 | Kolinski et al. | 395/306 |
| 5,640,763 | 6/1997 | Lindberg | 29/846 |
| 5,836,780 | 11/1998 | Mizumura et al. | 439/326 |
| 5,848,920 | 12/1998 | Klein et al. | 439/885 |
| 5,895,278 | 4/1999 | Humphrey | 439/101 |
| 5,908,333 | 6/1999 | Perino et al. | 439/631 |
| 5,930,119 | 7/1999 | Berding | 361/788 |
| 5,951,665 | 9/1999 | Crane, Jr. et al. | 710/26 |

FOREIGN PATENT DOCUMENTS

| | | |
|---|---|---|
| 0 676 833 | 4/1990 | European Pat. Off. . |
| 0 436 943 | 7/1991 | European Pat. Off. . |
| WO 93 08624 | 4/1993 | WIPO . |

OTHER PUBLICATIONS

International Search Report, PCT/US99/03479, 6 pages.

*Primary Examiner*—Jeffrey Gaffin
*Assistant Examiner*—David Foster

[57] ABSTRACT

A connector with a staggered contact design is described. The connector comprises a first row of connector pins, the connector pins alternately proximal pins and distal pins. The connector further comprises a second row of connector pins alternately proximal pins and distal pins. The distal pins of the connector carry the signals, while the proximal pins are ground or power signals.

9 Claims, 16 Drawing Sheets

MOTHERBOARD HAVING ONE-BETWEEN TRACE CONNECTIONS FOR CONNECTORS

The present invention is a Division of U.S. Ser. No. 08/925,243 Sep. 8, 1997 U.S. Pat. No. 5,887,833 and Division of U.S. Ser. No. 09/024,822 Feb. 17, 1998 relates to connectors, and more specifically, to connectors for interconnecting circuit boards.

FIELD OF THE INVENTION

BACKGROUND

Daughter boards are coupled to a motherboard via sockets, to expand the functionality of the motherboard. For example, the daughter boards may contain memory modules, or other expansion units to the motherboard.

FIG. 1 illustrates a prior art motherboard including daughter boards coupled to the motherboard via sockets. A motherboard 110 includes a plurality of sockets 120. The sockets 120 are coupled to traces 130 on the motherboard 110. The traces 130 couple signals together, as is known in the art. A daughter card 140 is designed to be inserted into a socket 120. The daughter card 140 includes a number of contacts 150 and 160 on both sides of the daughter card 140. The contacts 150 160 of the daughter card 140 make contact with the socket 12:0. The socket 120 connects these contacts 150 and 160 to the traces 130 on the motherboard 110. The daughter card 140 illustrated has alternating ground contacts 150 and signal contacts 160 on the contact edges of the daughter card 140.

FIG. 2 illustrates a top view of a prior art socket 120. The circles 210, 220 represent the solder holes in the motherboard that receive the pins from the socket. The straight lines 230 represent the contact plane of the daughter board, that is, the area into which the daughter board is inserted. As can be seen, the pins are alternately distal pins and proximal pins. A distal pin is defined as a pin that has its base, the area that contacts the motherboard, far from the center of the socket. A proximal pin is defined as a pin that has its base, the area that contacts the motherboard, close to the center of the socket.

The socket includes two parallel rows of pins. The two rows of pins on the socket are arranged to maximize the distance between pins. Thus, each proximal pin faces a distal pin, and each distal pin faces a proximal pin.

The pins are alternately distal pins and proximal pins. Both rows of pins alternate one signal pin 210 and one ground pin 220. The two rows 230 of pins are arranged such that each distal pin in the first row faces a proximal pin in the second row.

FIG. 3 illustrates two cross sections of the prior art socket 120. The first cross section 290 is taken at the cross section line 290 in FIG. 2. The second cross section 295 is taken at the second cross section line 295 in FIG. 2.

Returning to FIG. 3, the first cross section 290 illustrates one distal pin 320 and one proximal pin 310. For one embodiment, the proximal pin 310 and the distal pin 320 are both ground pins 220. The daughter board 330 is inserted such that it contacts both the distal pin 320 and proximal pin 310, one on either side of the daughter board 330. The contacts on both sides of the daughter board 330 at that cross section 290 are ground contacts 220.

The second cross section 295 similarly illustrates one distal pin 350 and out proximal pin 360. In this instance, both the distal pin 350 and proximal pins 360 are signal pins 210. Again, both pins are in contact with the daughter board 330, on either side.

FIG. 4 illustrates a prior art pattern of traces on the motherboard. The circles represent contact areas at which the bases of the pins are attached. The G represents "ground," while the S represents "signal" connections. The first group of contact areas 410, 420, 430, 440 corresponds to a first socket, while the second group of contact areas 450, 460, 470, and 480 corresponds to a second socket. The first signal connection of the first socket is coupled to the first signal connection of the second socket, the second signal connection of the first socket is coupled to the second signal connection of the second socket, and so on. The interconnection is accomplished using traces 130 on the motherboard 110. The traces 130 are routed to maximize the distance between any two traces.

Closely spaced traces 130 may cause interference in some instances, or actual contact between the traces 130 if the traces are imperfectly fabricated. The trace pattern illustrated in FIG. 4 is one prior art trace pattern. As can be seen, the trace pattern has two signal traces 130 crossing between two contact areas 440 at location 490. This is called "two-between routing." Using "two-between routing" may cause interference between the signals carried by either of the traces. Furthermore, having two traces between the contact areas requires the use of thinner traces, to fit the traces between the contact area spacing. Additionally, thin traces have an increased impedance, that does not match the impedance of the signals from the daughter board. Impedance mismatch causes reflected signals, thus degrading signal integrity and limiting operating frequency. Additionally, the connector size is limited by the constraints of printed circuit board design rules associated with "two-between routing."

SUMMARY AND OBJECTS OF THE NVENTION

It is an object of this invention to provide a "one-between routing" of traces on the motherboard between parallel sockets.

It is a further object of this invention to provide an improved socket that does not require changing of the daughter board modules designed to be inserted into the socket.

A connection between a motherboard and a daughter board is described The connector comprises two rows of connector pins, the connector pins in each row alternately distal pins and proximal pins. The proximal pins of the connector carry the signals, while the distal pins are ground or power signals.

Other objects, features, and advantages of the present invention will be apparent from the accompanying drawings and from the detailed description that follows below.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for a connector with staggered contact design are described. The staggered contact design changes the signal-ground pattern on the circuit board. The staggered contact design permits "one-between routing" when connecting like pin numbers together on two parallel connectors. For a socket including four rows of connector pins, the signals are moved to the two outside rows of pins, while the inside rows are ground and/or power.

For one embodiment, the present invention is designed to interconnect parallel connectors, connector A and connector B. In other words, pin 1 of connector A is connected to pin 1 of connector B, pin 2 of connector A is connected to pin 2 of connector B, and so on. For one embodiment, in the connector, one half of the connector pins are ground or power. That is, the signal to ground ratio is 1:1. For another embodiment, the signal to pin ratio is 1:2. The non-signal pins may be ground or power. For one embodiment, the signal lines are moved to the outside of each row, while the inside connections provide ground or power connections.

Moving the signals to the outside of the socket permits "one-between routing" of signal traces. Having "one-between routing" permits the use of a wider trace, use of smaller connector pitch, or looser printed circuit board design rules. Alternatively, moving the signals to the outside of the socket permits the use of a guard trace. A guard trace is a ground trace that is routed between signal traces.

Additionally, moving the signals to the outside of the socket permits hybrid surface mounting of the socket on the motherboard, since there are no uninspectable solder contacts.

Furthermore, moving the signals to the outside pins of the socket, while the ground signals are the inside pins, enables the ground contacts to be merged into a single component. Making the ground contacts a single component reduces the complexity of manufacturing and assembly.

Figure 5:
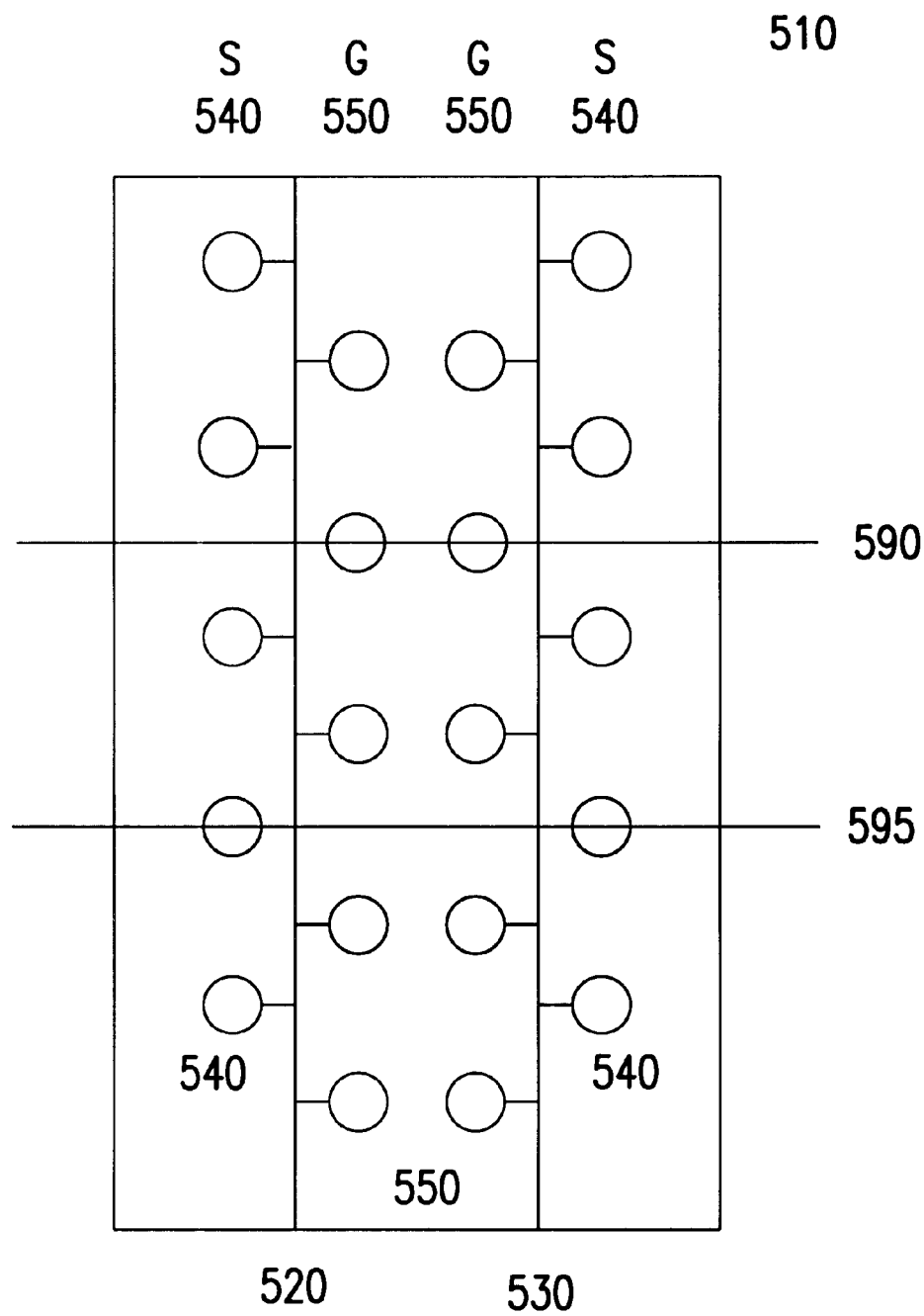
FIG. 5 illustrates a top view of one embodiment of the socket according to the present invention.

FIG. 5 illustrates a top view of one embodiment of a socket 510 according to the present invention. The circles represent the bottom of the pins, designed to be soldered into the motherboard. The lines represent the tops of the same pins, aligned along a first line 520 and a second line 530. The tops of the pins form a separable interconnect to a daughter card. Lines 520, 530 are referred to as the contact plane.

The pins alternate being proximal pins 550 and distal pins 540. A distal pin 540 is a pin 540 that has its base, the area that contacts the motherboard, far from the center of the socket. A proximal pin 550 is a pin 550 that has its base, the area that contacts the mother board, close to the center of the socket.

For one embodiment, the distal pins 540 carry signals, while the proximal pins 550 are ground and/or power signals. The two rows of pins 540, 550 are arranged such that each proximal pin 550 in the first row faces a proximal pin 550 in the second row. The distal pins 540 are similarly aligned. This places the proximal pins 550 closer together, but spaces the distal pins 540 further apart. Placing two ground pins 550 closely together does not violate manufacturing guidelines, since shorting adjacent ground pins 550 does not cause a problem. Similarly, shorting adjacent power pins 550 does not violate manufacturing guidelines. Therefore, for an alternating signal-ground pin arrangement, the present arrangement is advantageous by further separating pins carrying signals.

For one embodiment, each set of two facing proximate pins 550 is either a set of ground pins or a set of power pins. For one embodiment, the first set of proximal pins 550 carries a power signal, while the remaining sets of proximal pins 550 carry a ground signal.

Figure 6:
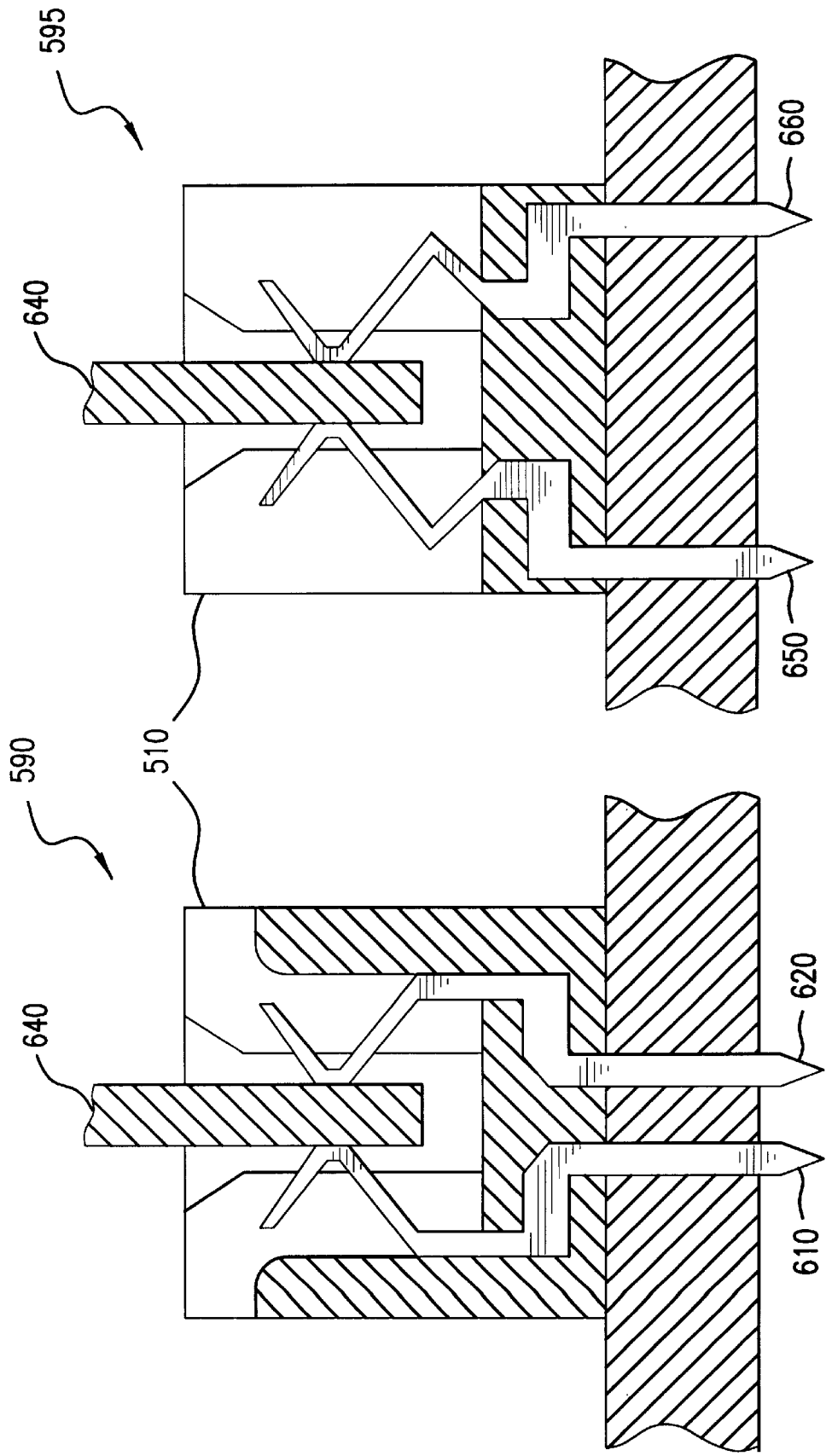
FIG. 6 illustrates two cross sections of the socket of FIG. 5, illustrating the pins.

FIG. 6 illustrates two cross sections of the socket 510 of FIG. 5. The first cross section 590 is taken at the cross section line 590 in FIG. 5. The second cross section 595 is taken at the second cross section line 595 in FIG. 5.

Returning to FIG. 6, the first cross section 590 illustrates two proximal pins 610, 620. For one embodiment, both pins 610, 620 are ground pins. The daughter board 640 is inserted such that it contacts both pins 610, 620. As can be seen, the contacts on the daughter board 640 at that cross section are both ground pins 610, 620.

The second cross section 595 illustrates two distal pins 650, 660. In this instance, both distal pins 650, 660 are signal pins. Again, both pins are in contact with the daughter board 640.

Figure 7:
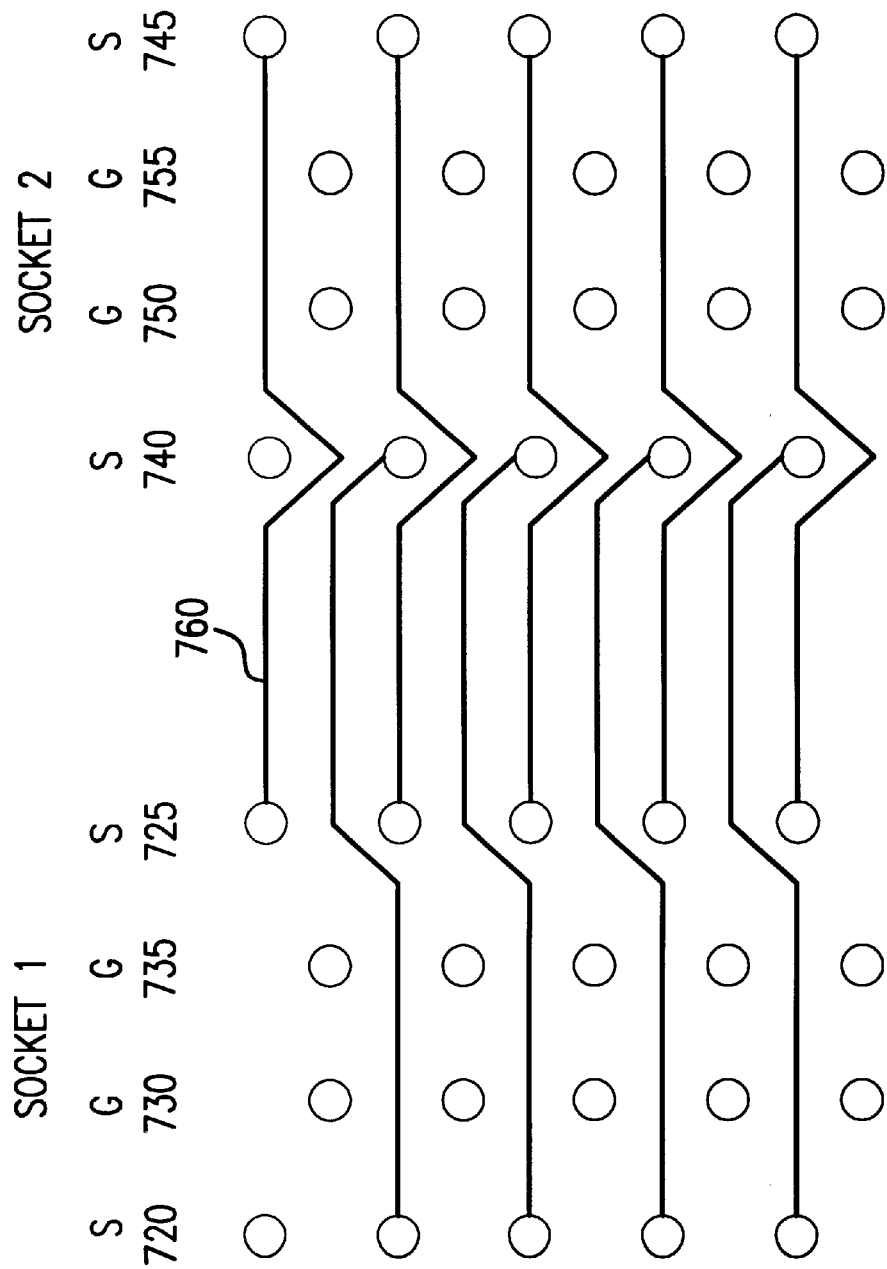
FIG. 7 illustrates one embodiment of the pattern of traces on the motherboard according to the present invention.

FIG. 7 illustrates a view of the traces on the motherboard according to the present invention. The motherboard is designed to receive multiple sockets, to interconnect daughter boards to the motherboard. For one embodiment, sockets similar to the socket illustrated in FIG. 5, are coupled to the motherboard. In order to interconnect the signals brought in by the sockets, traces on the motherboard couple the contact areas to which the signals are coupled.

The first set of signal connections is the outside connections 720, 725 of a first socket. Similarly, the a second set of signal connections 740 and 745 are the outside pins of a second socket. The contact areas associated with the proximal pins of both the first and second socket are ground signals. Traces on the motherboard couple the appropriate signal contact areas together. Thus, signal connection 720 is coupled to signal connection 740, while signal connection 725 is coupled to signal connection 745, etc.

A trace 760 couples signal connections 725 and 745. As can be seen, only a single trace is routed between any two connections. This is referred to as "one-between routing." For one embodiment, the ground connections 730, 735, 750, 755 are grounded using a ground plane on the backside of the motherboard.

Figure 4:
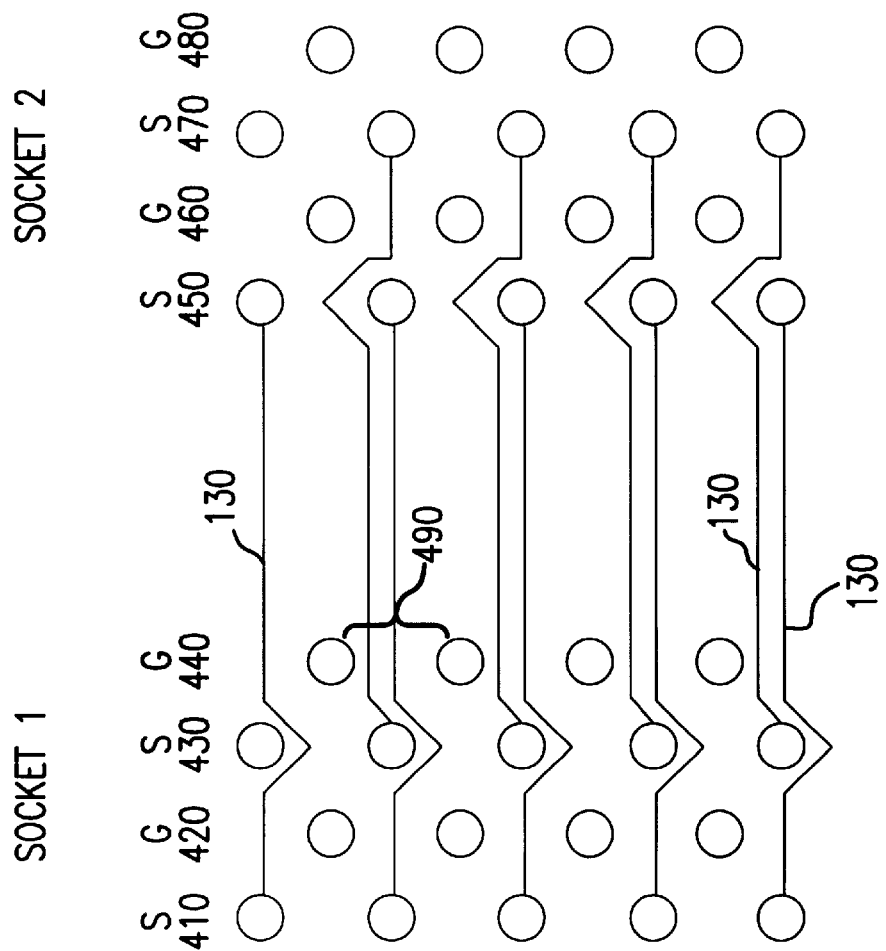
FIG. 4 illustrates a prior art pattern of traces on the motherboard.
Figure 8:
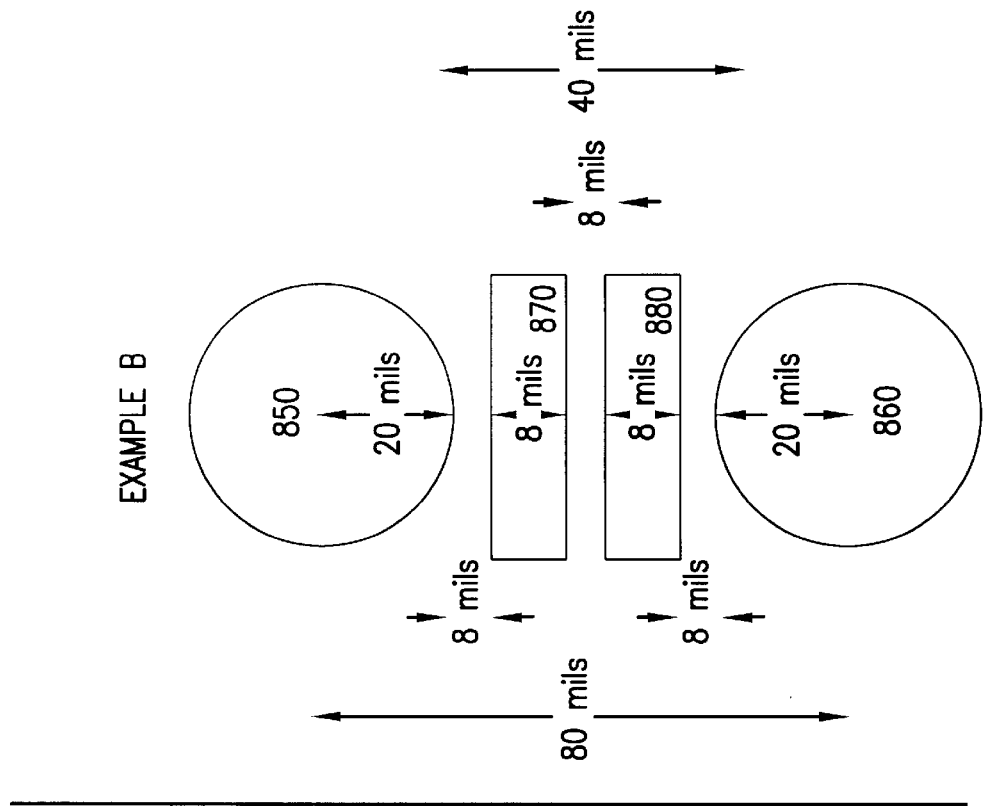
FIG. 8 illustrates a prior art trace spacing on a prior art motherboard.
Figure 8:
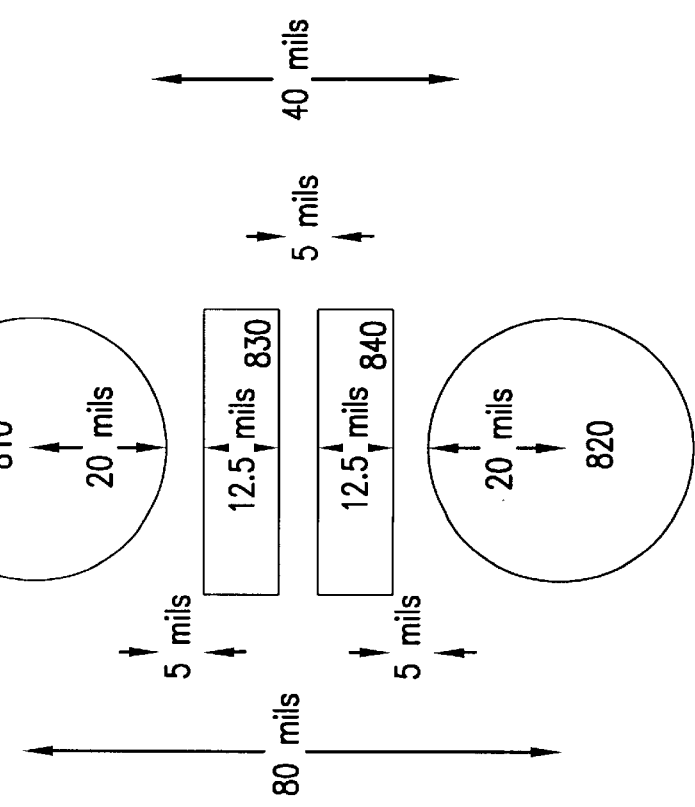

FIG. 8 illustrates prior art trace spacing on a prior art motherboard. Example A illustrates the traces between a first two contact areas 810 820. As shown in prior art FIG. 4, two traces 830, 840 are routed between two contact areas. FIG. 8 illustrates two exemplary spacings. There is 80 mils—a mil is one thousandth of an inch, 0.0254 millimeters—of space between the center of the two contact areas 810 and 820. Generally contact areas 810 820 have a radius of 20 mils. Having a contact area 810 820 with a smaller radius leads to more defective circuit boards being fabricated. Additionally, reducing the radius leads to more expensive manufacturing. The remaining distance between the outer edges of the contact areas 810 820 is 40 mils (80 mils—2*20 mils). Two traces 830 840 are fitted into that space. There are five areas between the two contact areas 810 820, i.e., (1) a first distance from the first contact area to a first trace; (2) a first trace; (3) a second distance from the first trace to the second trace; (4) a second trace; and (5) a third distance from the second trace to the second contact area.

Example A illustrates minimizing the distances between traces 830 840 and contact areas 810 820, while maximizing the width of the traces 830 840. Maximizing the width of the traces 830 840 decreases the impedance of the traces 830 840. A minimum distance between traces 830 840 and contact areas 810 820 that may be implemented is 5 mils. With a spacing of 5 mils, the width of the traces 830 840 is 12.5 mils. For one embodiment, the traces are a microstrip line having a 5 mil dielectric thickness and an effective dielectric constant of 3.6. For such a microstrip trace 830, 840, the impedance of a 12.5 mil trace 830 840 is approximately 45 ohms. Reducing impedance of the traces 830, 840 to match low impedance lines/signals is advantageous because a matched impedance eliminates reflected signals, and signal deterioration.

Example B illustrates another prior art method of spacing. Again, two contact areas 850 860 are illustrated, with two traces 870, 880 routed between the contact areas 850 860. In Example B, each of the distances, (1) to (5), are set to be equal. Since there are five distances, and 40 mils, each of the traces, and the distances between the traces are set to 8 mils. For one embodiment, an 8 mil trace, with a 5 mil dielectric thickness and an effective dielectric constant of 3.6, has an approximate impedance of 55 ohms.

Figure 9:
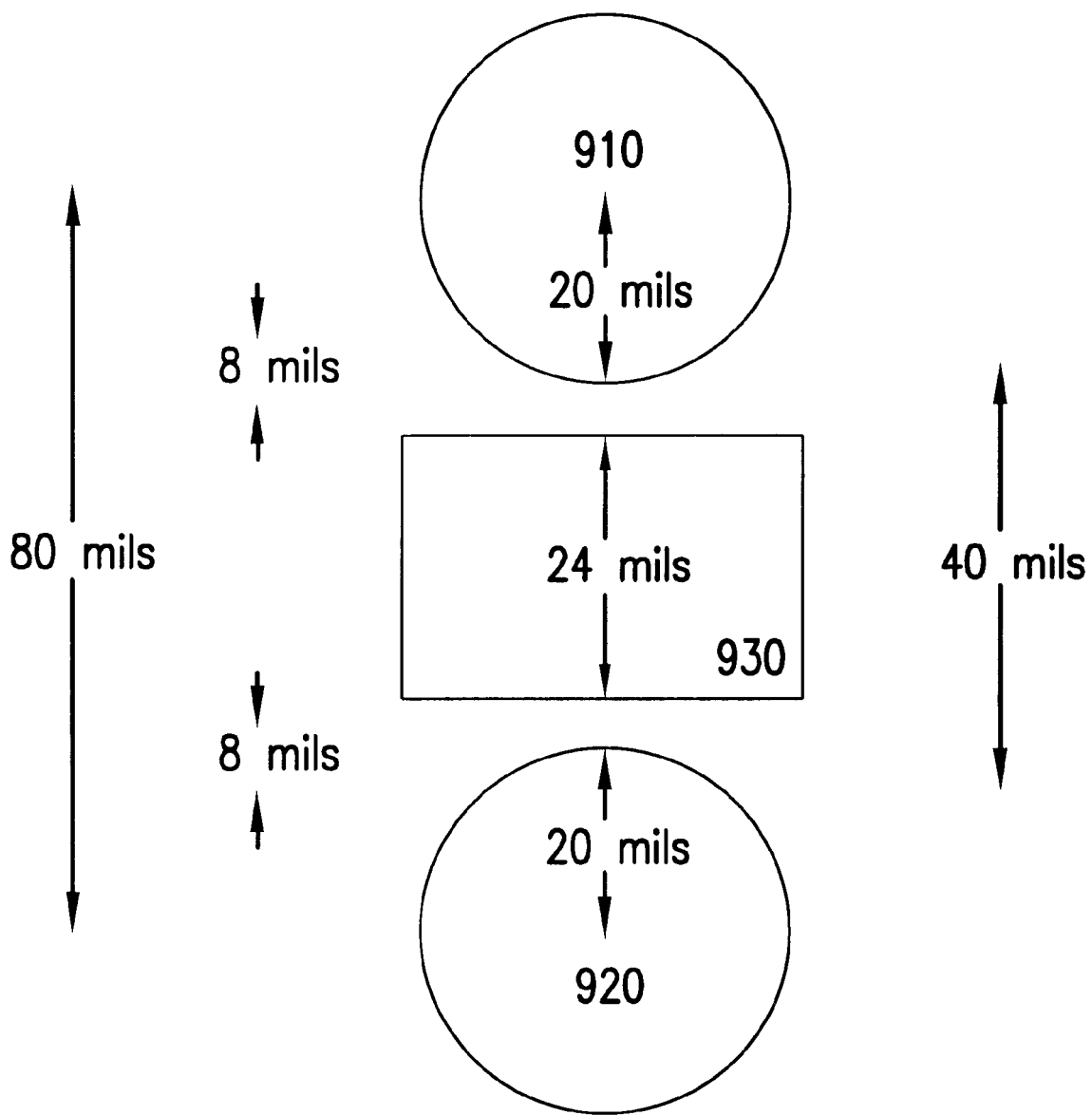
FIG. 9 illustrates a one embodiment of trace spacing on the motherboard according to the present invention.

FIG. 9 illustrates a trace spacing on the motherboard according to one embodiment of the present invention. As shown in FIG. 7, only a single trace is routed between any two contact areas 910, 920 according to the present invention. As in the prior art, the spacing between the contact areas 910 920 is 80 mils. The radius of the contact areas 910, 920 is 20 mils, for one embodiment. The width of trace 930 is determined based on the impedance to be matched. For one embodiment, the trace 930 is designed to have a 5 mil dielectric thickness and an effective dielectric constant of 3.6. For such a trace, if the impedance to be matched is 28 ohms, the trace 930 is 24 mils in width. A trace 930 having a width of 24 mils leaves 16 mils for spacing. Thus, the distance from the trace 930 to each of the contact areas 910 920 is 8 mils. This large spacing prevents most interference and possible short circuiting between the trace 930 and the contact areas 910 920. Permitting larger spacing simplifies manufacturing and permits looser PCB tolerances.

Figure 10:
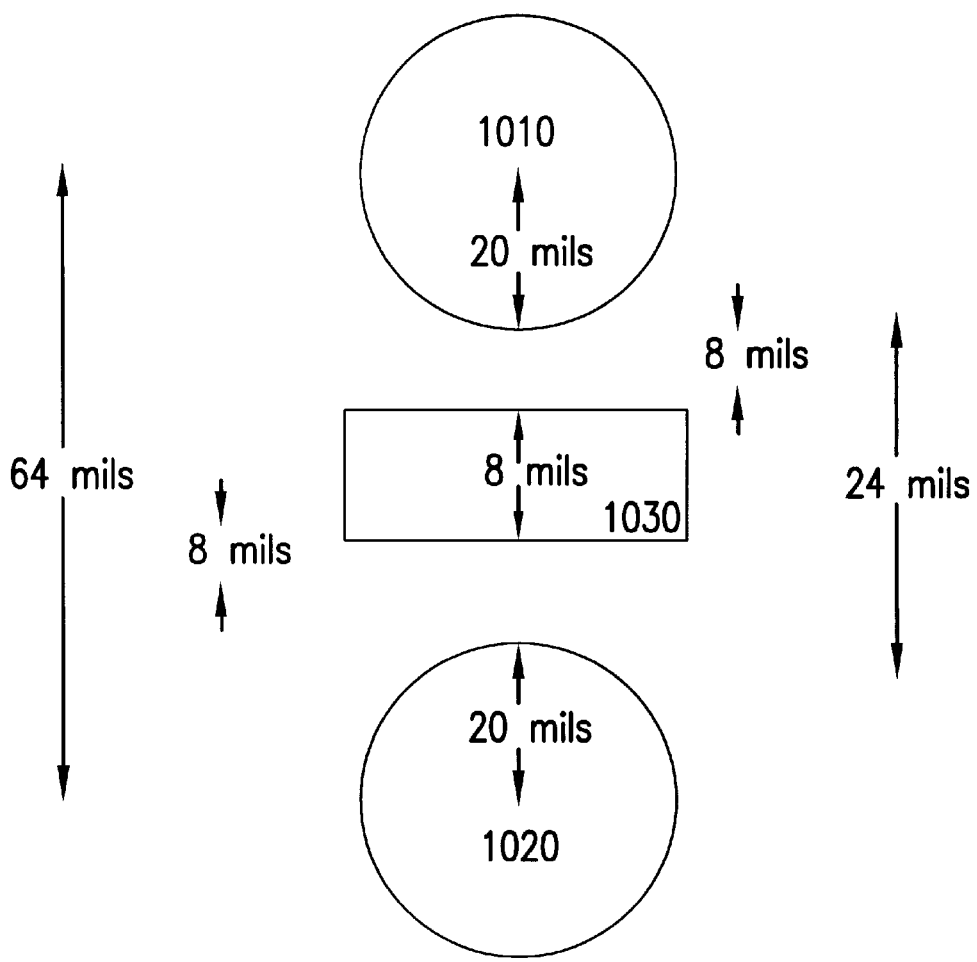
FIG. 10 illustrates another embodiment of trace spacing on the motherboard according to the present invention.

FIG. 10 illustrates an alternative trace spacing on the motherboard according to another embodiment of the present invention. As shown in FIG. 7, the present invention permits "one-between routing" for traces. Therefore, it is possible to reduce the spacing of the contact area centers on the motherboard. In other words, the distance between the contact area centers may be reduced. This is illustrated in FIG. 10.

The two contact areas 1010, 1020 each have a radius of 20 mils. The width of trace 1030 is set to 8 mils. The distance between the trace 1030 and each of the contact areas 1010, 1020 is also set to 8 mils. This permits a distance between the centers of the two contact areas of 64 mils. Thus, instead of a distance between contact areas of 80 mils, a 64 mil pitch is used. This is advantageous because it uses less space.

Figure 11:
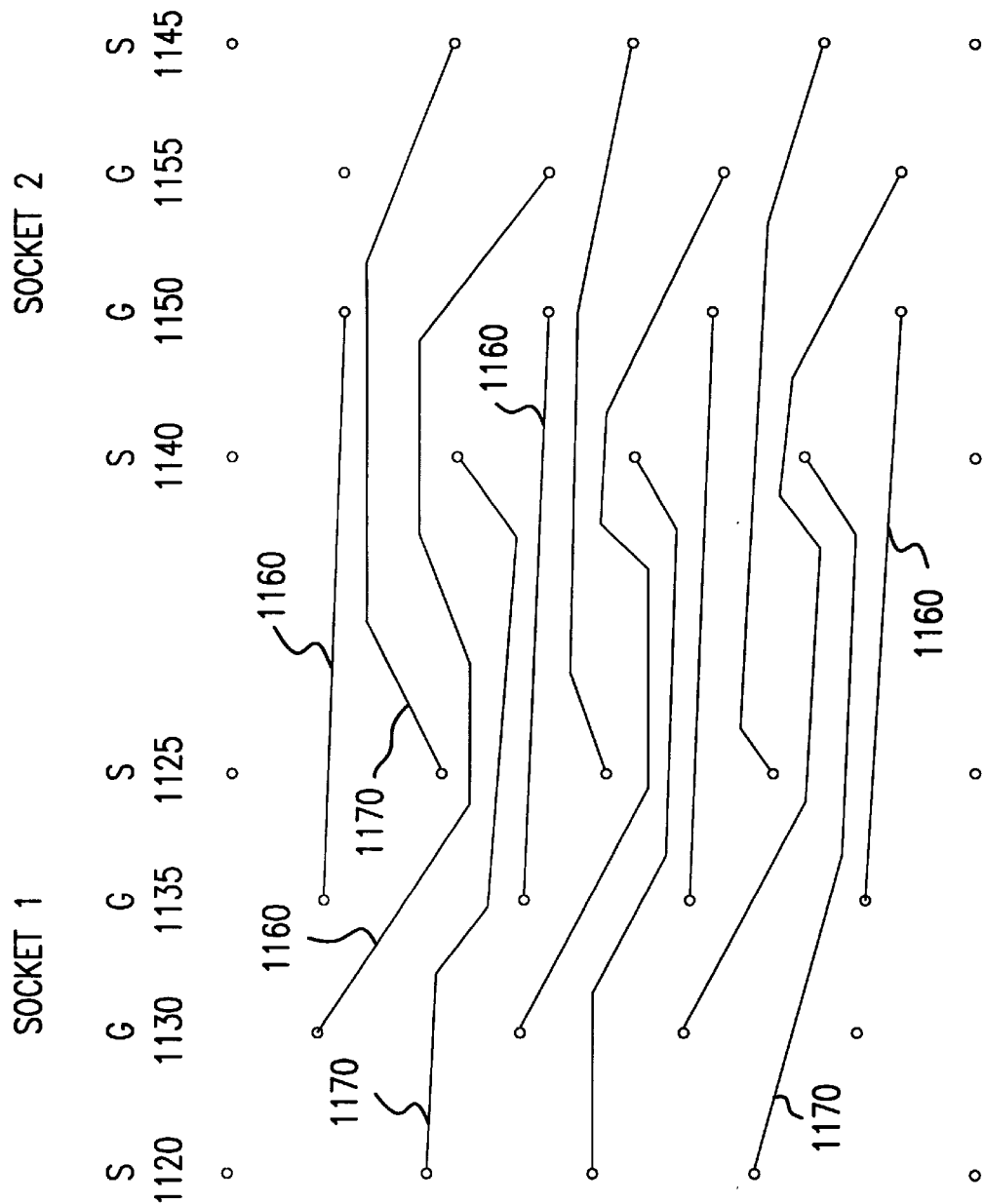
FIG. 11 illustrates traces on the motherboard including isolating traces, according to one embodiment of the present invention.

FIG. 11 illustrates traces 1160, 1170 on the motherboard including isolating traces 1160, according to one embodiment of the present invention. In some instances signals carried on the trace 1170 interconnecting signal contact areas 1120 to 1140 and the trace 1170 interconnecting signal contact areas 1125 to 1145 may interfere with each other. Such signal interference is known in the art. One method of preventing signal interference is to provide ground traces 1160 between the signal traces 1170. For one embodiment, ground traces 1160 prevent interference. For one embodiment, the ground traces 1160 reduce mutual capacitance and mutual inductance. Thus, by placing ground traces 1160, coupling ground contact areas 1130 to 1155 and 1135 to 1150, between the signal traces 1170, noise is reduced.

The ground traces 1160 couple together ground contact areas between two sockets. Thus, for example, a first signal trace 1170 couples together a first contact area 1120 from a first socket with a first contact area 1140 of a second socket. A second signal trace 1170 couples together a second contact area 1125 from the first socket with a second contact area 1145 of the second socket. A thin ground trace 1160 is placed between these two signal traces 1170. The thin ground trace 1160 couples together a first ground contact area 1135 from the first socket with a first ground contact area 1150 from the second socket. Similarly, the second ground contact area 1130 from the first socket is coupled to a second ground contact area 1155 from the second socket. For one embodiment, the ground traces 1160 are placed between each two signal traces 1170. Alternatively, ground traces may be selectively used between signal traces 1170 that may cause interference.

The width of the ground traces 1160 is only limited by the manufacturing process used, for one embodiment. Using a 6 mil wide ground trace 1160 is of low cost. Using a 6 mil ground trace 1160, and the minimum 6 mil spacing between the ground trace 1160 and the contact areas 1120–1155, allows the use of a signal trace 1170 having a width of 16 mils.

Figure 1:
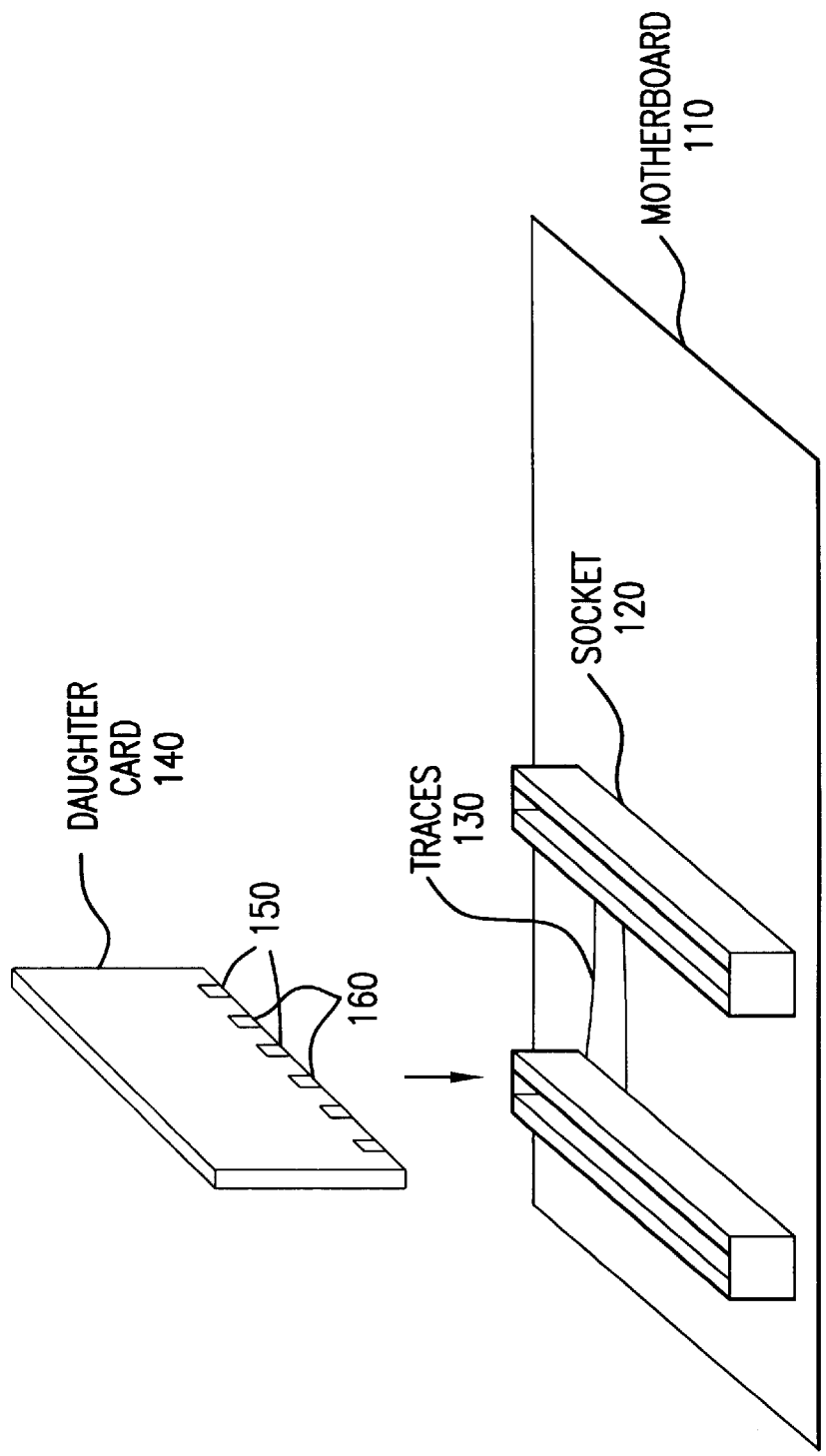
FIG. 1 illustrates a prior art motherboard including daughter boards coupled to the motherboard via sockets.
Figure 2:
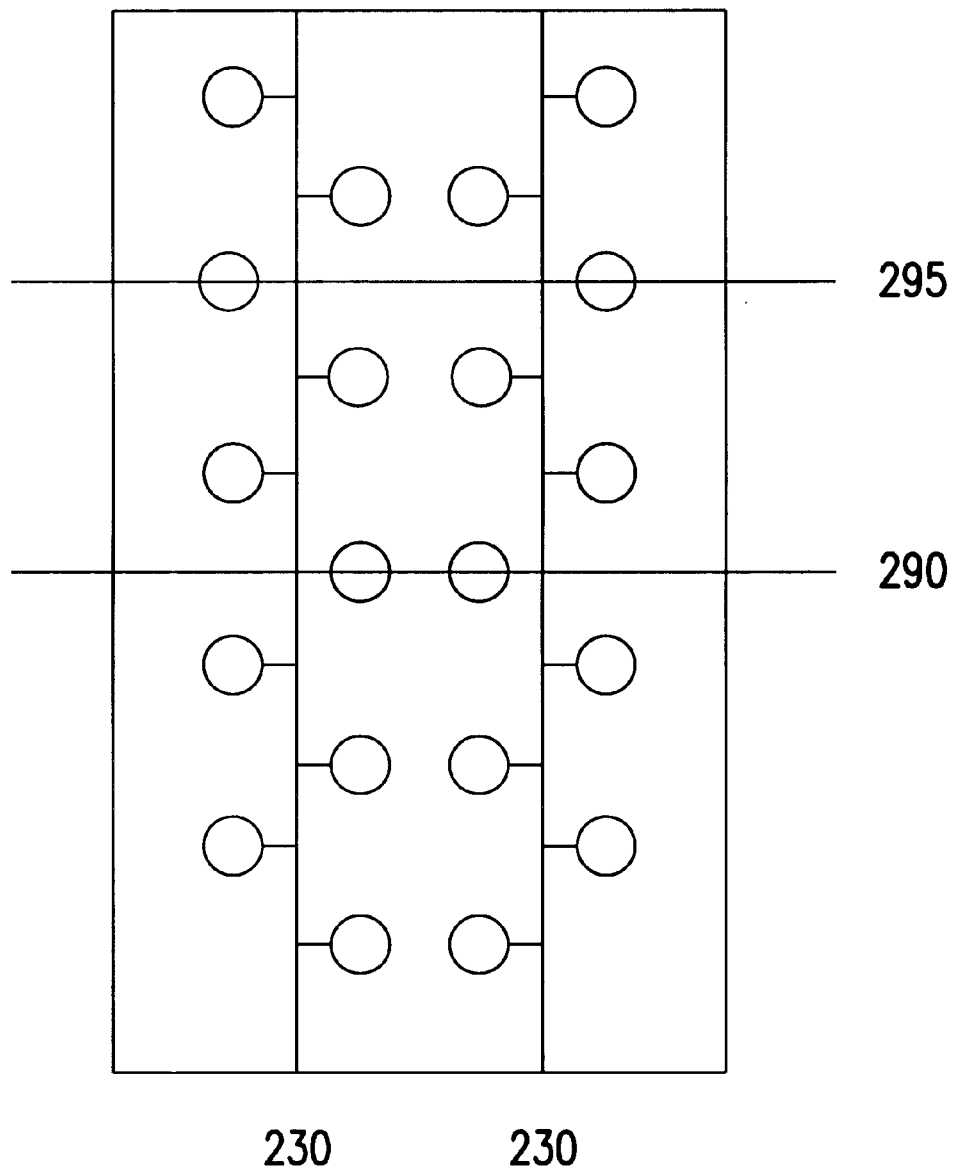
FIG. 2 illustrates a top view of a prior art socket.
Figure 3:
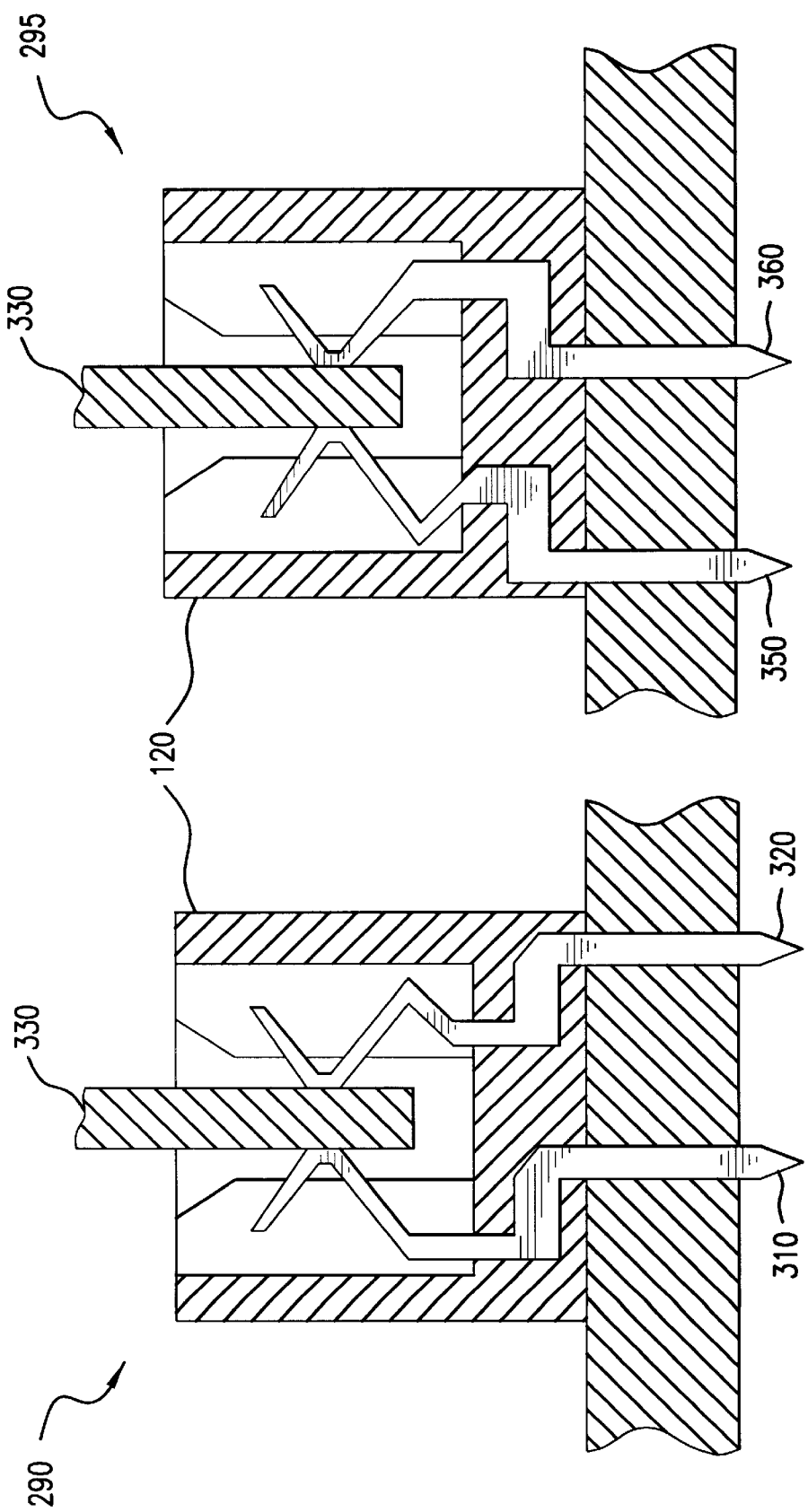
FIG. 3 illustrates two cross sections of the prior art socket of FIG. 2, illustrating the pins.
Figure 12:
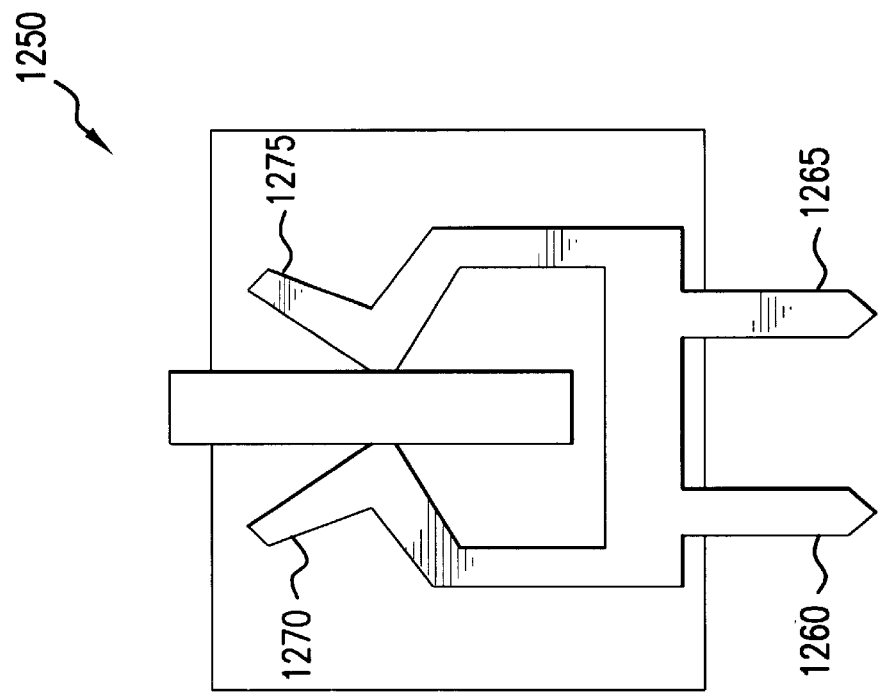
FIG. 12 illustrates on embodiment of a ground pin used in the socket of the present invention.
Figure 12:
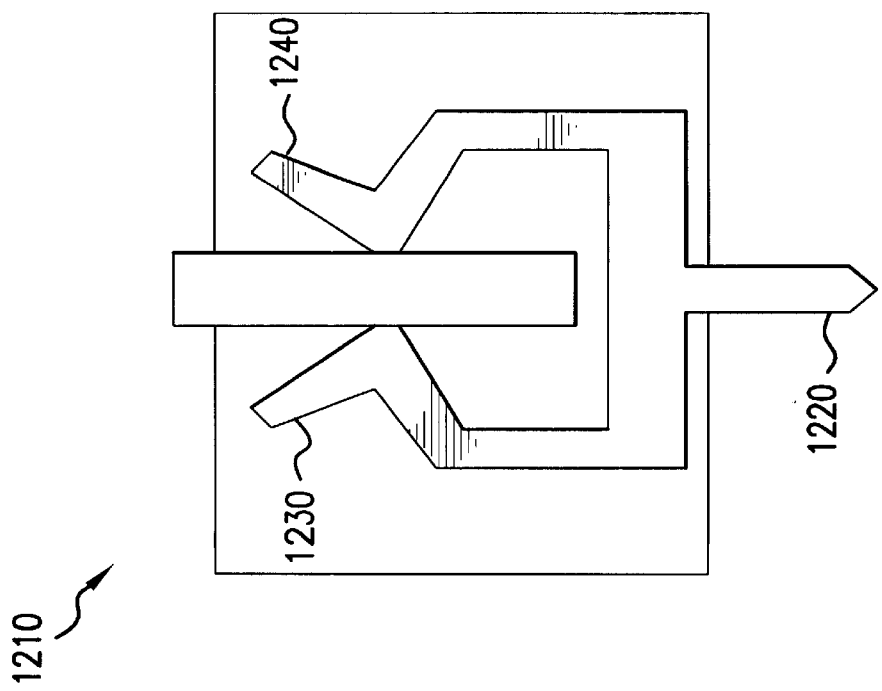

Generally the pins used in the present invention for both the ground and signal pins are substantially identical to the prior art pins illustrated in FIG. 2. Alternative embodiments of the ground pin are illustrated in FIG. 12. The ground pins for the present invention are all proximal pins. Each set of two ground pins face each other, as shown in FIG. 6. Therefore, the two ground pins may be combined with a single base. This reduces manufacturing complexity. One embodiment of the combined pin 1210 includes a single base 1220 and two pin heads 1230, 1240.

Another alternative pin 1250 is a ground pin consisting of a single element, but which fits into a current socket design. The second ground pin design 1250 includes two base extensions 1260 and 1265, while the top of the pin is the same as the first ground pin design 1210. This permits using socket design of FIG. 5, while reducing inductance of the pin 1250.

Figure 13:
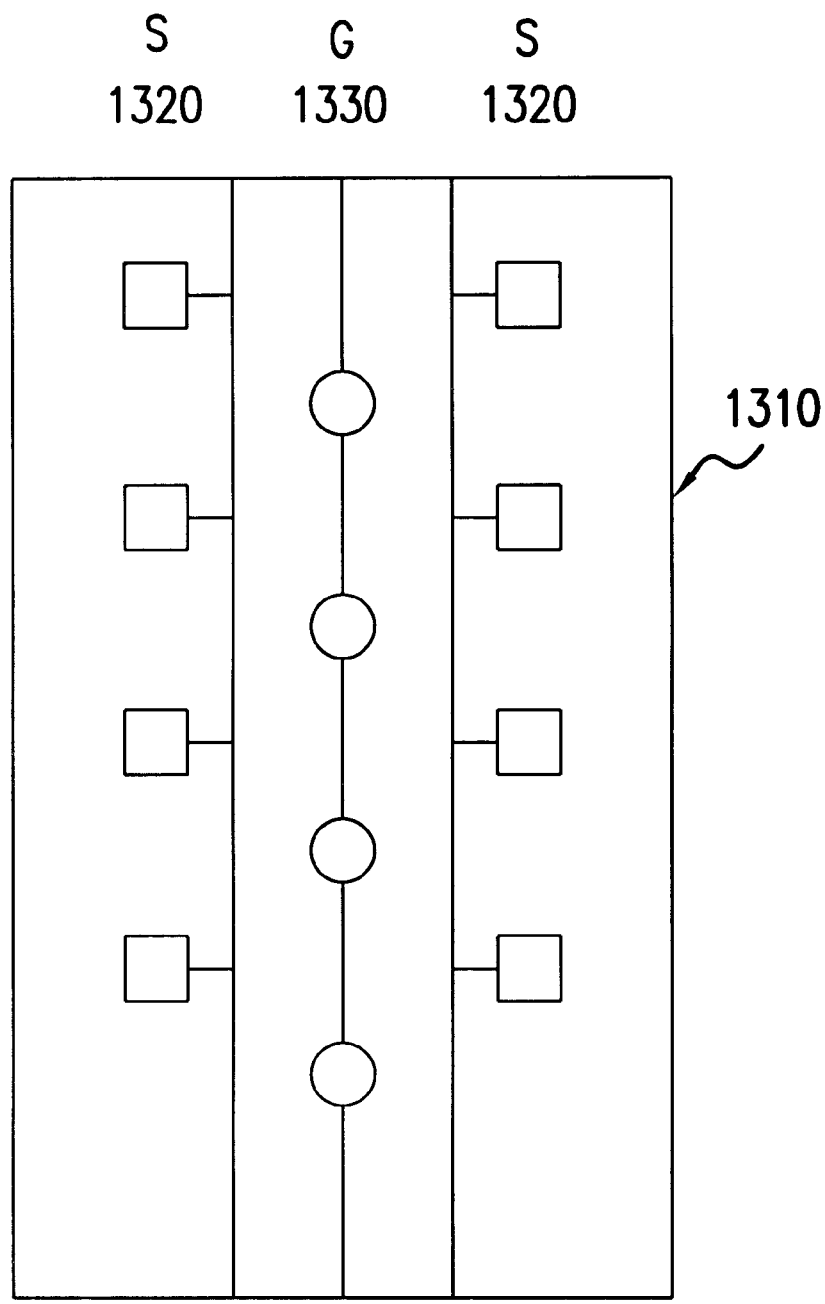
FIG. 13 illustrates one embodiment of the socket using the ground pin of FIG. 12.

The socket for the combined ground pin illustrated in FIG. 12 is shown in FIG. 13. Specifically, while the signal pins 1320 are aligned, on either side of the socket 1310, the ground pins 1330 are located in the middle of the socket

1310. This reduces the number of components used, since each two ground pin heads correspond to a single pin base for ground pins 1330. An additional slit in the socket body is used to receive the ground pins. For one embodiment, the additional slit is located in the center of the socket. Thus, a first and second side slits receive the signal pins, while a center slit receives the ground pins.

Figure 14:
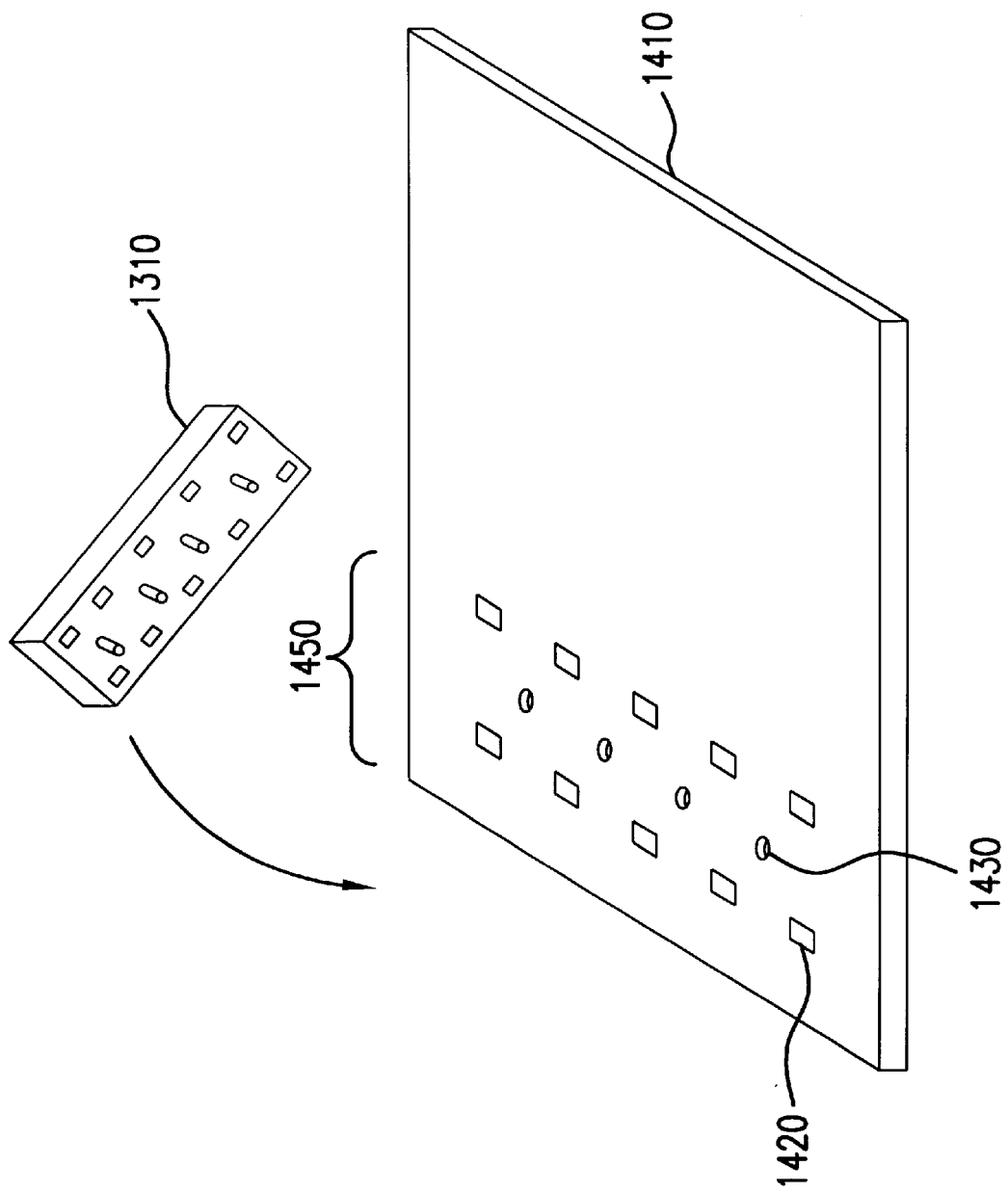
FIG. 14 illustrates one embodiment of a hybrid surface mounting for the present invention.

FIG. 14 illustrates one embodiment of a motherboard 1410 for hybrid surface mounting. The embodiment shown uses sockets such as the one illustrated in FIG. 13. Alternatively, the socket illustrated in FIG. 5 may be used for hybrid mounting.

The signal contact areas 1420 are located on the outside of each socket, while the ground contact area 1430 is located at the center of the socket. The sockets are hybridly mounted on the motherboard. That is, the signal contact areas 1420 are mounted to the motherboard using surface mounting techniques. The ground contact areas 1430 are mounted to the motherboard using standard connections bored through the motherboard 1410. This is referred to hybrid mounting.

The surface mounted signal connections 1420 may be visually inspected, since they are located on the outside of each socket. The standard inside connections 1430 may be inspected or repaired on the bottom of the board. Such hybrid mounting reduces cost and increases the reliability of the connections.

Figure 15:
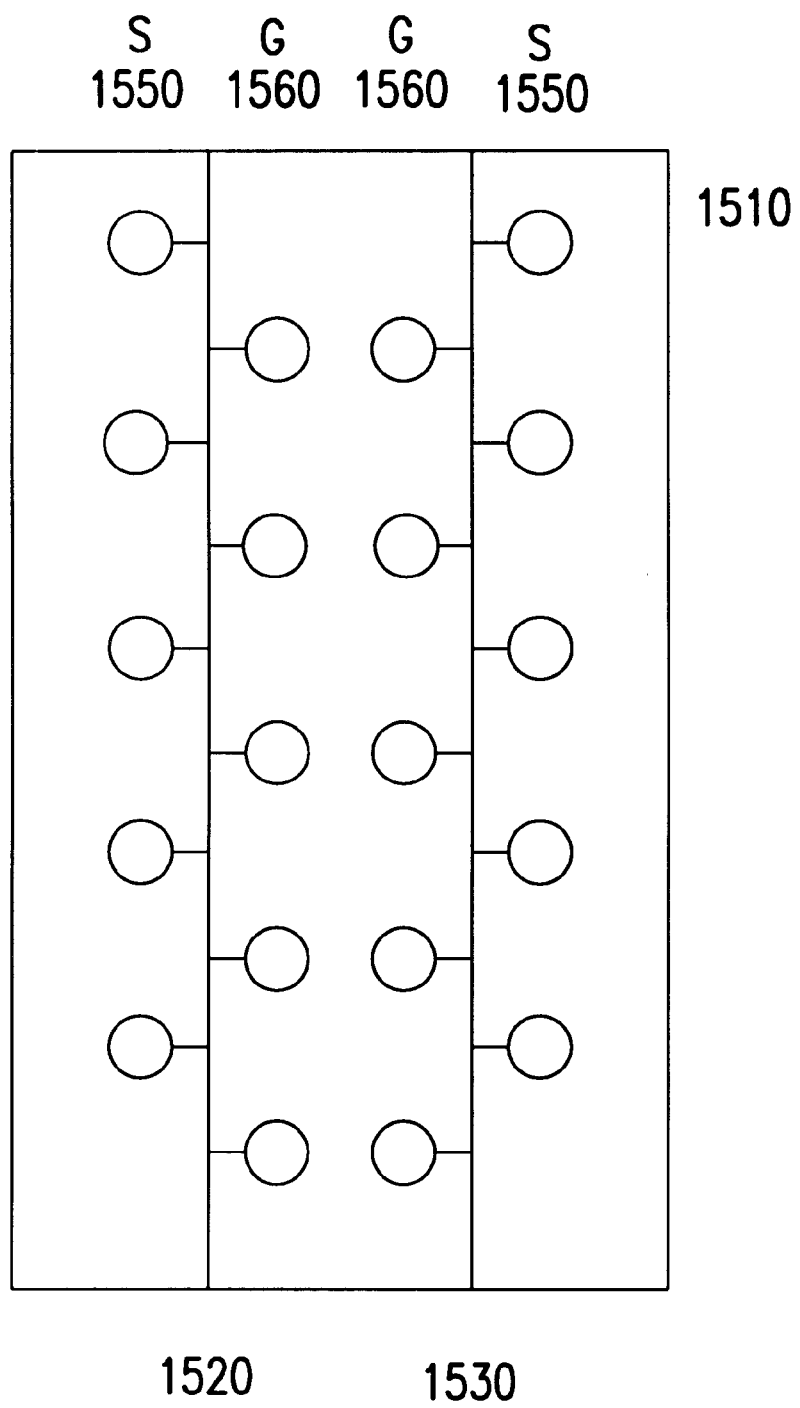
FIG. 15 illustrates another embodiment of the socket according to the present invention.

FIG. 15 illustrates a top view of another one embodiment of a socket 1510 according to the present invention. The circles represent the bottoms of the pins, designed to be soldered into the motherboard. The lines represent the tops of the same pins, aligned along a first line 1520 and a second line 1530. The tops of the pins form a separable interconnect to a daughter card. Lines 1520, 1530 are referred to as the contact plane.

Figure 16:
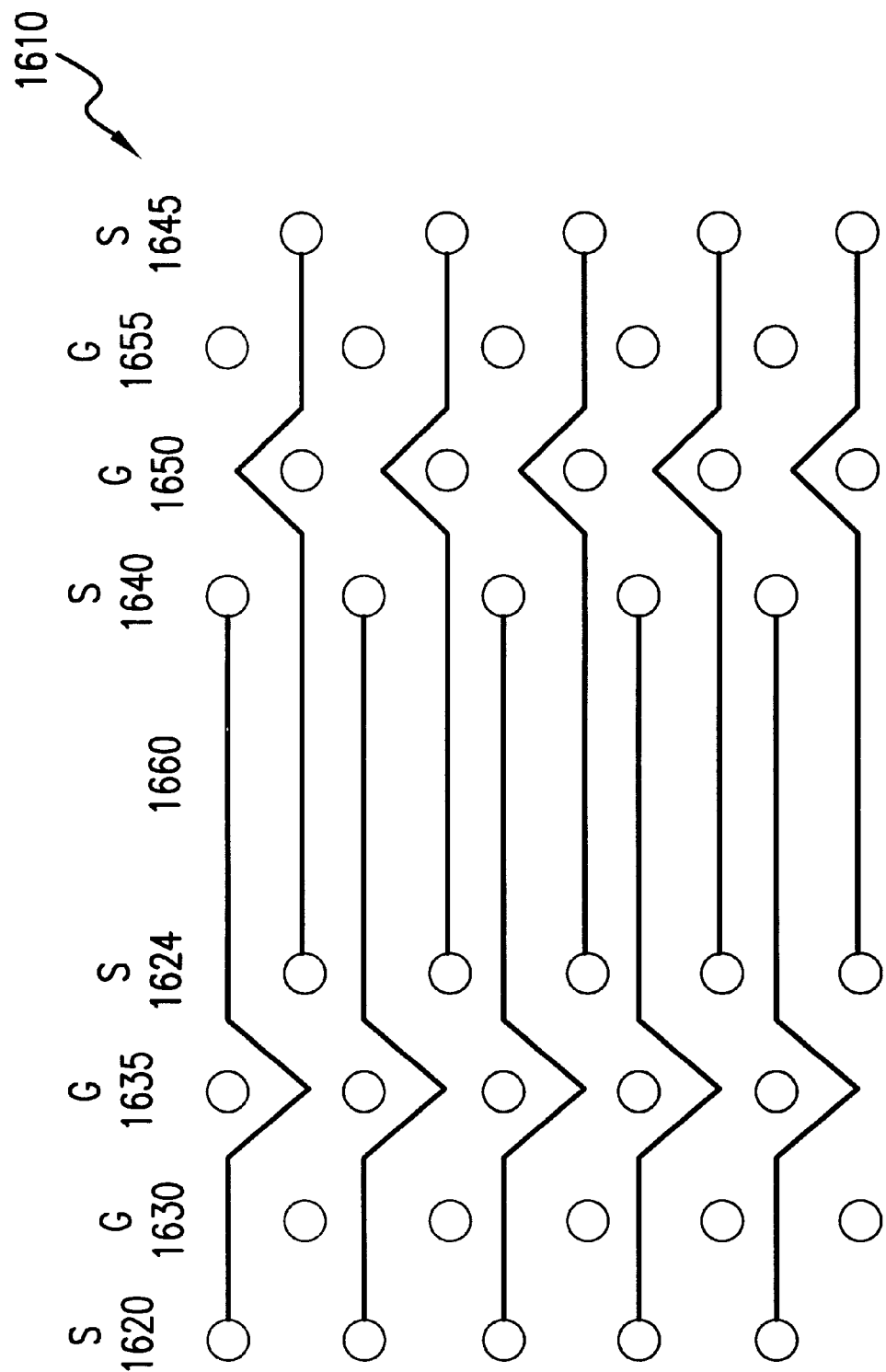
FIG. 16 illustrates a trace spacing on the motherboard according to another embodiment of the present invention using the socket of FIG. 15.

The pins are alternately proximal pins 1560 and distal pins 1550. For one embodiment, the distal pins 1550 are signal pins, while the proximal pins 1560 are ground pins. The two rows of pins 1520, 1530 are arranged such that each proximal pin 1560 in the first row faces a distal pin 1550 in the second row. FIG. 16 illustrates the motherboard for the socket illustrated in FIG. 15, and having the "one-between routing" discussed above. In this instance, the daughter board has to be changed. The dual-sided connections on the daughter board generally are designed such that signal contacts on both sides of the contact area of the daughter board are of the same type, either ground or signal contacts. In the system illustrated in FIGS. 15 and 16, a signal contact on one side of the daughter board would be aligned with a ground contact on the opposite side of the daughter board.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A motherboard comprising:

a first connector having a first plurality of pins;

a second connector having a second plurality of pins;

a plurality of traces formed on the motherboard to connect selected pins in the first plurality of pins with selected pins in the second plurality of pins, such that no more than a single trace from the plurality of traces passes between any two adjacent pins in the first and second plurality of pins.

2. The motherboard of claim 1, wherein the first plurality of pins comprises at least one columnar arrangement of distal pins alternating with proximal pins.

3. The motherboard of claim 2, wherein the second plurality of pins comprises at least one columnar arrangement of distal pins alternating with proximal pins.

4. The motherboard of claim 2, wherein the distal pins in at least the first connector form signal connections between the first connector and the second connector.

5. The motherboard of claim 4, wherein the proximal pins in at least the first connector form ground connections.

6. The motherboard of claim 5, wherein the ground connections are not routed by traces.

7. A motherboard comprising first and second connectors, wherein the first and second connector each comprise:

first and second columnar arrangements of distal pins;

first and second columnar arrangements of proximal pins formed between the first and second columnar arrangements of distal pins; and, a plurality of signal traces formed on the motherboard such that each signal trace connects one distal pin in the first connector with another distal pin in the second connector, and such that no more than one signal trace passes between any two adjacent pins in either the first connector or the second connector.

8. The motherboard of claim 7, wherein each signal trace connects either one distal pin in the first columnar arrangement of distal pins in the first connector with another distal pin in the first columnar arrangement of distal pins in the second connector, or one distal pin in the second columnar arrangement of distal pins in the first connector with another distal pin in the second columnar arrangement of distal pins in the second connector.

9. The mother board of claim 7, further comprising:

a plurality of guard traces formed on the mother board such that each guard trace connects one proximal pin in the first connector with another proximal pin in the second connector, and such that adjacent signal traces in the plurality of signal traces are separated by at least one guard trace.

* * * * *